US012621010B2

(12) United States Patent
Leung et al.

(10) Patent No.:   US 12,621,010 B2
(45) Date of Patent:       May 5, 2026

(54) ON-DEMAND DECODING METHOD AND APPARATUS

(71) Applicant: HUAWEI TECHNOLOGIES CO., LTD., Shenzhen (CN)

(72) Inventors: Wai Kong Raymond Leung, Shenzhen (CN); Kechao Huang, Shenzhen (CN); Huixiao Ma, Shenzhen (CN); Shiyao Xiao, Shenzhen (CN); Dongyu Geng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 187 days.

(21) Appl. No.: 18/146,794

(22) Filed: Dec. 27, 2022

(65) Prior Publication Data

US 2023/0136251 A1     May 4, 2023

Related U.S. Application Data

(63) Continuation of application No. PCT/CN2021/104390, filed on Jul. 3, 2021.

(30) Foreign Application Priority Data

Jul. 3, 2020    (CN) .......................... 202010631750.4

(51) Int. Cl.
*H03M 13/00*        (2006.01)
*H03M 13/15*        (2006.01)

(52) U.S. Cl.
CPC ....... *H03M 13/159* (2013.01); *H03M 13/611* (2013.01)

(58) Field of Classification Search
CPC ............. H03M 13/159; H03M 13/611; H03M 13/3707; H03M 13/3746; H03M 13/45;

(Continued)

(56) References Cited

U.S. PATENT DOCUMENTS 8,751,912 B1 *   6/2014   Varnica ................. H04L 1/0057
                                                            714/801
9,166,623 B1 *  10/2015   Bates ................ H03M 13/1555
                            (Continued)

FOREIGN PATENT DOCUMENTS

EP          2819310 A1    12/2014
EP          3331180 A1     6/2018
RU          2612593 C1     3/2017

OTHER PUBLICATIONS

ITU-T G.709/Y.1331, "Series G: Transmission Systems and Media, Digital Systems and Networks; Digital terminal equipments—General; Series Y: Global Information Infrastructure, Internet Protocol Aspects And Next Generation Networks; Internet protocol aspects—Transport; Interfaces for the Optical Transport Network (OTN)," Telecommunication Standardization Sector of ITU, Mar. 2003, 118 pages.

(Continued)

*Primary Examiner* — Mark D Featherstone
*Assistant Examiner* — Rong Tang
(74) *Attorney, Agent, or Firm* — Fish & Richardson P.C.

(57)            ABSTRACT

This application discloses decoding methods, apparatuses, and computer-readable storage media, which may be applied to a plurality of scenarios such as a metropolitan area network, a backbone network, and data center interconnection. An example method includes: obtaining syndromes corresponding to a plurality of codewords; grouping the syndromes into groups; and sorting priorities of each group of syndromes; and selecting, based on a priority sorting result of each group of syndromes, a syndrome for decoding.

20 Claims, 7 Drawing Sheets

Iterative decoding

Codeword sequence input → Codeword sequence grouping and priority sorting → Dynamic decoding scheduling → Decoding of a decoder → Codeword and syndrome updating → Codeword sequence output

(58) Field of Classification Search
CPC . H03M 13/6561; H03M 13/152; H03M 13/19
See application file for complete search history.

(56) References Cited

U.S. PATENT DOCUMENTS

| | | | |
|---|---|---|---|
| 9,692,450 B2* | 6/2017 | Khalil | H03M 13/114 |
| 2003/0106014 A1 | 6/2003 | Dohmen et al. | |
| 2010/0241933 A1 | 9/2010 | Latremouille | |
| 2014/0033001 A1 | 1/2014 | Zhang et al. | |
| 2017/0272097 A1 | 9/2017 | Weng | |
| 2019/0089384 A1* | 3/2019 | Kumano | G06F 11/108 |
| 2020/0083911 A1* | 3/2020 | Heo | H03M 13/2963 |
| 2021/0103494 A1* | 4/2021 | Zhang | H03M 13/1575 |

OTHER PUBLICATIONS

Extended European Search Report in European Appln No. 21832381.
4, dated Feb. 26, 2024, 18 pages.
International Search Report and Written Opinion in International
Appln. No. PCT/CN2021/104390, mailed on Oct. 8, 2021, 15 pages
(with English translation).
Partial Supplementary European Search Report in European Appln
No. 21832381.4, dated Oct. 25, 2023, 18 pages.

* cited by examiner

Obtain a syndrome corresponding to each of a plurality of codewords — 301

Group obtained syndromes, and sort priorities of each group of syndromes — 302

Select, based on a priority sorting result of each group of syndromes, a syndrome for decoding — 303

1
2
⋮
16
First decoding unit — 1

17
18
⋮
32
Second decoding unit — 2

33
34
⋮
48
Third decoding unit — 3

49
50
⋮
64
Fourth decoding unit — 4

ON-DEMAND DECODING METHOD AND APPARATUS

CROSS-REFERENCE TO RELATED APPLICATIONS

This application is a continuation of International Application No. PCT/CN2021/104390, filed on Jul. 3, 2021, which claims priority to Chinese Patent Application No. 202010631750.4, filed on Jul. 3, 2020. The disclosures of the aforementioned applications are hereby incorporated by reference in their entireties.

TECHNICAL FIELD

This application relates to a decoding technology, and in particular, to a low-power-consumption on-demand decoding technology.

BACKGROUND

A forward error correction (Forward Error Correction, FEC) encoding technology is widely used in wireless cellular, wireless network, storage, and high-speed optical transmission systems. A start point of the forward error correction encoding technology is to add some check bits when a transmitter performs encoding and to calculate the check bits in a receive end bitstream in which a bit error occurs to correct the bit error in the bitstream, to reduce a signal-to-noise ratio (Optical Signal Noise Ratio, OSNR) tolerance of a receive end, thereby improving bit error rate performance of the system, improve reliability of system communication, prolong a signal transmission distance, reduce transmit power of the transmitter, and reduce system costs.

In recent years, the optical communications system has been rapidly developed from 100 Gbps to 400 Gbps, and further developed to a future optical communications system of 800 Gbps, imposing a higher requirement on an FEC encoding gain and also causing FEC encoding to be closer to a Shannon limit. Consequently, FEC decoding is becoming more complex, and decoding power consumption is becoming higher, and therefore a product requirement cannot be met.

SUMMARY

This application provides a decoding method, to sort priorities of input codewords and perform on-demand decoding scheduling, to resolve a problem that decoding complexity is high and decoding power consumption is high in the conventional technology.

According to a first aspect, a decoding method is provided. The method includes: obtaining a syndrome corresponding to each of a plurality of codewords; grouping obtained syndromes, and sorting priorities of each group of syndromes; and selecting, based on a priority sorting result of each group of syndromes, a syndrome for decoding.

In this embodiment of this application, same decoding processing is not performed on syndromes of all codewords, to avoid a problem that a same quantity of decoding times need to be performed regardless of whether codewords are correct in a conventional static decoding solution, thereby implementing on-demand decoding and reducing a decoding resource requirement and system power consumption.

In a possible implementation, a priority of a non-zero syndrome is higher than a priority of a syndrome whose value is 0. Further, a priority of a non-zero syndrome decoded a large quantity of times is lower than a priority of a non-zero syndrome decoded a small quantity of times. In addition, a quantity of decoding times may be further limited. When a quantity of times of decoding a syndrome reaches a threshold, the syndrome is no longer decoded. For example, the threshold may be set to three times, and provided that the quantity of times of decoding the syndrome reaches 3, the syndrome is no longer decoded. More opportunities are provided for decoding a syndrome that needs to be decoded, thereby improving decoding efficiency.

Optionally, in a case of hard decision, a priority of a non-zero syndrome is always higher than a priority of a syndrome whose value is 0. In a case of soft decision decoding, a priority of a non-zero syndrome may always be higher than a priority of a syndrome whose value is 0, or a quantity of decoding times may be preferential. For example, regardless of whether a value of a syndrome is 0, a priority of a syndrome decoded a large quantity of times is lower than a priority of a syndrome decoded a small quantity of times, and if two syndromes are decoded a same quantity of times, a priority of a non-zero syndrome is higher than a priority of a syndrome whose value is 0. In addition, when soft decision decoding is used, priority sorting may be alternatively performed based on reliability of soft information. This is not limited in this application.

In a possible implementation, the decoding method is applied to a decoding apparatus that includes a plurality of decoding units. The selecting a syndrome for decoding includes: selecting a maximum of one syndrome from each group, and separately sending selected syndromes to different decoding units for hard decision or soft decision decoding, where all the selected syndromes are non-zero syndromes. Because when hard decision decoding is used, a syndrome whose value is 0 does not need to be decoded, if values of all syndromes in a group are 0, no syndrome in the group is selected for decoding, and therefore a maximum of one syndrome is selected from each group. In this case, a storage unit of each group of syndromes only needs to be connected to a corresponding decoding unit, so that connection complexity is reduced. Certainly, a maximum of two or more syndromes may be alternatively selected from each group. In this case, a storage unit of each group of syndromes is connected to two or more decoding units. It should be understood that in a case of soft decision decoding, a zero syndrome may be decoded to improve decoding performance; or may not be decoded to reduce decoding complexity.

In a possible implementation, the decoding method is applied to a decoding apparatus that includes a plurality of decoding units. The selecting a syndrome for decoding includes: selecting one syndrome from each group, and separately sending selected syndromes to different decoding units for soft decision decoding. In this case, a storage unit of each group of syndromes only needs to be connected to a corresponding decoding unit, so that connection complexity is reduced. Certainly, two or more syndromes may be alternatively selected from each group. In this case, a storage unit of each group of syndromes is connected to two or more decoding units.

Optionally, a quantity of groups obtained through grouping is the same as a quantity of decoding units, to use decoding resources to the greatest extent.

In a possible implementation, the decoding method is applied to a decoding apparatus that includes plurality of decoding units. The selecting a syndrome for decoding includes: selecting a maximum of one syndrome from each group, and separately sending selected syndromes to different decoding units for hard decision or soft decision decoding; and sorting priorities of every two groups of syndromes again, selecting a maximum of one syndrome from every two groups again based on a sorting result, and separately sending selected syndromes to different decoding units for hard decision or soft decision decoding, where the syndromes selected two times are different, and all the selected syndromes are non-zero syndromes. In a possible implementation, the decoding method is applied to a decoding apparatus that includes a plurality of decoding units. The selecting a syndrome for decoding includes: selecting one syndrome from each group, and separately sending selected syndromes to different decoding units for soft decision decoding; and sorting priorities of every two groups of syndromes again, selecting one syndrome from every two groups again based on a sorting result, and separately sending selected syndromes to different decoding units for soft decision decoding, where the syndromes selected two times are different. Further, the grouping obtained syndromes includes: dividing the obtained syndromes into $\frac{2}{3}n$ groups, where n is a quantity of decoding units, and n is an integer multiple of 3.

In this solution, it can also be ensured that a maximum of one syndrome is selected each time, and algorithm complexity is low. In addition, only the selected syndrome needs to be decoded, so that most unnecessary decoding operations are avoided, and power consumption is low. A storage unit of a syndrome also only needs to be connected to a corresponding decoding unit, so that connection complexity is low. Optionally, two or more syndromes may be selected from each group.

In addition, a current working status of the decoding unit needs to be considered. If a decoding unit is idle, the idle decoding unit is used as far as possible, to avoid unbalanced load of decoding units.

In a possible implementation, all the groups include a same quantity of syndromes to implement even grouping, so that it can be ensured that algorithm complexity is relatively low when the syndrome is selected.

In a possible implementation, syndromes included in each group have different numbers or addresses, and corresponding syndromes may be identified based on different numbers or addresses, to sort priorities of the syndromes.

In a possible implementation, after the selected syndrome is decoded, the method further includes: sorting priorities of each group of syndromes again, and selecting, based on a current priority sorting result, a syndrome again for decoding. Further, in the two processes of sorting the priorities of each group of syndromes, priority sorting methods may be different.

In a possible implementation, the method further includes: if a first syndrome is successfully decoded, updating, based on a decoding result, the first syndrome and a codeword corresponding to the first syndrome, where the first syndrome is one of the syndromes for decoding.

With reference to the foregoing possible implementation, in this implementation, the updating, based on a decoding result, the first syndrome and a codeword corresponding to the first syndrome specifically includes: superimposing a delta syndrome corresponding to the first syndrome and the first syndrome to obtain an updated syndrome; and flipping, based on a flip bit, a bit that is in the corresponding codeword and that corresponds to the flip bit, where the decoding result includes the delta syndrome and the flip bit.

In a possible implementation, all syndromes have same storage time. In other words, all the syndromes are stored in storage units for same time. Assuming that the time is two microseconds, after the storage time reaches two microseconds, the syndrome is overwritten with a newly received syndrome. Similarly, codewords corresponding to the syndromes also have same storage time. Further, to-be-decoded time of all the syndromes is the same. Assuming that the to-be-decoded time is one microsecond, when storage time of the syndrome reaches one microsecond, regardless of whether the syndrome is decoded, an address of the syndrome is considered as an invalid address, and the syndrome is no longer decoded and is overwritten with a newly stored syndrome.

In this embodiment of this application, decoding resources may be mostly used for a newly stored syndrome instead of a syndrome that is stored for a long time without an accurate result, to implement on-demand allocation of the decoding resources and improve decoding efficiency.

In a possible implementation, the method further includes: decoding a soft information amplitude corresponding to the selected syndrome, where when soft decision decoding is performed, a syndrome and a soft information amplitude corresponding to the syndrome need to be decoded together, and if the decoding succeeds, an updated soft information amplitude is obtained in addition to a delta syndrome and a flip bit; superimposing the delta syndrome and the corresponding syndrome to obtain an updated syndrome; and flipping, based on the flip bit, a bit that is in a corresponding codeword and that corresponds to the flip bit, and then replacing the original soft information amplitude with the updated soft information amplitude to complete decoding.

In a possible implementation, the method further includes: storing, in groups, syndromes corresponding to a first frame, where quantities of syndromes that correspond to the first frame and that are stored in the groups differ by a maximum of one, and the first frame includes a plurality of codewords. Optionally, a same quantity of syndromes corresponding to codewords from a same frame are stored in the groups, in other words, there are a same quantity of syndromes in storage units, to implement even storage. In this embodiment of this application, load processed by each storage unit is an average value of storage load. Therefore, this design ensures that all the storage units have substantially consistent load, to balance thermal densities and avoid local overheating.

According to a second aspect, a decoding apparatus is provided. The apparatus includes a controller and a decoder. The controller is configured to: obtain a syndrome corresponding to each of a plurality of codewords, and group obtained syndromes, and is further configured to: sort priorities of each group of syndromes, select a syndrome based on a priority sorting result of each group of syndromes, and send the syndrome to the decoder. The decoder is configured to decode the received syndrome.

In this embodiment of this application, same decoding processing is not performed on syndromes corresponding to all codewords, to avoid a problem that a same quantity of decoding times need to be performed regardless of whether codewords are correct in a conventional static decoding solution, thereby implementing on-demand decoding and reducing a decoding resource requirement and system power consumption.

In a possible implementation, a priority of a non-zero syndrome is higher than a priority of a syndrome whose value is 0. Further, a priority of a non-zero syndrome decoded a large quantity of times is lower than a priority of a non-zero syndrome decoded a small quantity of times. In addition, a quantity of decoding times may be further limited. When a quantity of times of decoding a syndrome reaches a threshold, the syndrome is no longer decoded. For example, the threshold may be set to three times, and provided that the quantity of times of decoding the syndrome reaches 3, the syndrome is no longer decoded. More opportunities are provided for decoding a syndrome that needs to be decoded, thereby improving decoding efficiency.

In a possible implementation, the controller is configured to: select a maximum of one syndrome from each group, and separately send selected syndromes to different decoding units in the decoder for hard decision or soft decision decoding, where all the selected syndromes are non-zero syndromes. Because when hard decision decoding is used, a syndrome whose value is 0 does not need to be decoded, if values of all syndromes in a group are 0, no syndrome in the group is selected for decoding, and therefore a maximum of one syndrome is selected from each group. In this case, a storage unit of the syndrome only needs to be connected to a corresponding decoding unit, so that connection complexity is reduced. Certainly, a maximum of two or more syndromes may be alternatively selected from each group. In this case, a storage unit of each group of syndromes is connected to two or more decoding units. It should be understood that in a case of soft decision decoding, a zero syndrome may be decoded to improve decoding performance; or may not be decoded to reduce decoding complexity.

In a possible implementation, the controller is configured to: select one syndrome from each group, and separately send selected syndromes to different decoding units in the decoder for soft decision decoding. During soft decision decoding, regardless of whether a syndrome is 0, the syndrome may be selected for decoding. In this case, a storage unit of each group of syndromes only needs to be connected to a corresponding decoding unit, so that connection complexity is reduced. Certainly, two or more syndromes may be alternatively selected from each group. In this case, a storage unit of each group of syndromes is connected to two or more decoding units.

Optionally, a quantity of groups obtained through grouping is the same as a quantity of decoding units, to use decoding resources to the greatest extent.

In a possible implementation, the controller is further configured to: select a maximum of one syndrome from each group, and separately send selected syndromes to different decoding units in the decoder for hard decision or soft decision decoding; and sort priorities of every two groups of syndromes again, select a maximum of one syndrome from every two groups again based on a sorting result, and separately send selected syndromes to different decoding units in the decoder for hard decision or soft decision decoding, where the syndromes selected two times are different, and all the selected syndromes are non-zero syndromes. In a possible implementation, the controller is further configured to: select one syndrome from each group, and separately send selected syndromes to different decoding units in the decoder for soft decision decoding; and sort priorities of every two groups of syndromes again, select one syndrome from every two groups again based on a sorting result, and separately send selected syndromes to different decoding units in the decoder for soft decision decoding, where the syndromes selected two times are different. Further, the controller is further configured to divide the obtained syndromes into $\frac{2}{3}n$ groups, where n is a quantity of decoding units, and n is an integer multiple of 3.

In this solution, it can also be ensured that a maximum of one syndrome is selected each time, and algorithm complexity is low. In addition, only the selected syndrome needs to be decoded, so that most unnecessary decoding operations are avoided, and power consumption is low. A storage unit of a syndrome also only needs to be connected to a corresponding decoding unit, so that connection complexity is low. Optionally, two or more syndromes may be selected from each group.

In a possible implementation, all the groups include a same quantity of syndromes to implement even grouping, so that it can be ensured that algorithm complexity is relatively low when the syndrome is selected.

In a possible implementation, syndromes included in each group have different numbers or addresses, and corresponding syndromes may be identified based on different numbers or addresses, to sort priorities of the syndromes.

In a possible implementation, the controller is further configured to: after sending the selected syndromes to the decoder, sort priorities of each group of syndromes again, select a syndrome from each group again based on a current priority sorting result, and send the syndrome to the decoder. Further, in the two processes of sorting the priorities of each group of syndromes, priority sorting methods may be different.

In a possible implementation, the controller is configured to: when a first syndrome is successfully decoded, update, based on a decoding result, the first syndrome and a codeword corresponding to the first syndrome, where the first syndrome is one of the syndromes sent to the decoder.

With reference to the foregoing possible implementation, in a possible implementation, the decoding apparatus further includes a memory. The decoder is further configured to: when successfully decoding the first syndrome, obtain a delta syndrome corresponding to the first syndrome and a flip bit; and send the delta syndrome and the flip bit to the memory. The controller is configured to superimpose the delta syndrome and the first syndrome, so that the memory stores an updated syndrome, and is further configured to flip, based on the flip bit, a bit that is in a corresponding codeword and that corresponds to the flip bit, so that the memory stores an updated bit.

In a possible implementation, all syndromes have same storage time. In other words, all the syndromes are stored in storage units for same time. Assuming that the time is two microseconds, after the storage time reaches two microseconds, the syndrome is overwritten with a newly received syndrome. Similarly, codewords corresponding to the syndromes also have same storage time. Further, to-be-decoded time of all the syndromes is the same. Assuming that the to-be-decoded time is one microsecond, when storage time of the syndrome reaches one microsecond, regardless of whether the syndrome is decoded, an address of the syndrome is considered as an invalid address, and the syndrome is no longer decoded and is overwritten with a newly stored syndrome.

In this embodiment of this application, decoding resources may be mostly used for a newly stored syndrome instead of a syndrome that is stored for a long time without an accurate result, to implement on-demand allocation of the decoding resources and improve decoding efficiency.

In a possible implementation, the controller is further configured to send a soft information amplitude corresponding to the selected syndrome to the decoder. The decoder is further configured to decode the soft information amplitude. When soft decision decoding is performed, a syndrome and a soft information amplitude corresponding to the syndrome need to be decoded together. If the decoding succeeds, an updated soft information amplitude is obtained in addition to a delta syndrome and a flip bit. Further, the decoder sends the delta syndrome, the flip bit, and the updated soft information amplitude to the memory. The memory is configured to store the delta syndrome, the flip bit, and the updated soft information amplitude. The controller is configured to superimpose the delta syndrome and the corresponding syndrome, so that the memory stores an updated syndrome, and is further configured to flip, based on the flip bit, a bit that is in a corresponding codeword and that corresponds to the flip bit, so that the memory stores an updated bit.

In a possible implementation, the decoding apparatus further includes a memory, and the memory includes a plurality of storage units. Quantities of syndromes that correspond to a first frame and that are stored in the storage units differ by a maximum of one, and the first frame includes a plurality of codewords. Optionally, a same quantity of syndromes corresponding to codewords from a same frame are stored in the storage units, to implement even storage. In this embodiment of this application, load processed by each storage unit is an average value of storage load. Therefore, this design ensures that all the storage units have substantially consistent load, to balance thermal densities and avoid local overheating.

In a possible implementation, the decoding apparatus further includes a scheduling unit, and main functions of the scheduling unit include: sending a syndrome in the memory to the decoder based on an indication of the controller, and sending, to the memory, a delta syndrome and a flip bit that are output by the decoder. For soft decision decoding, the scheduling unit further sends a soft information amplitude in the memory to the decoder based on an indication of the controller, and sends, to the memory, the soft information amplitude output by the decoder.

In particular, in actual implementation, to reduce power consumption, bandwidth of the scheduling unit may be limited. For example, a quantity of delta syndromes and a quantity of flip bits that are sent to the memory at each moment are limited to not exceed specific thresholds. In this case, the scheduling unit buffers a delta syndrome and a flip bit beyond the thresholds, and then sends the delta syndrome and the flip bit to the memory at a next moment.

According to a third aspect, a computer-readable storage medium is provided. The computer-readable storage medium stores instructions, and when the instructions run on a terminal device, the terminal device performs the method according to any one of the first aspect and the possible implementations of the first aspect.

According to a fourth aspect, a computer program product including instructions is provided. When the computer program product runs on a terminal device, the terminal device performs the method according to any one of the first aspect and the possible implementations of the first aspect.

In embodiments of this application, same decoding processing is not performed on syndromes corresponding to all codewords, to avoid a problem that a same quantity of decoding times need to be performed regardless of whether codewords are correct in a conventional static decoding solution, thereby implementing on-demand decoding and reducing a decoding resource requirement and system power consumption. In addition, selection is performed based on groups, so that algorithm complexity can be reduced. In addition, a storage unit of a syndrome only needs to be connected to a corresponding decoding unit, so that connection complexity is also reduced.

DESCRIPTION OF EMBODIMENTS

Figure 1:
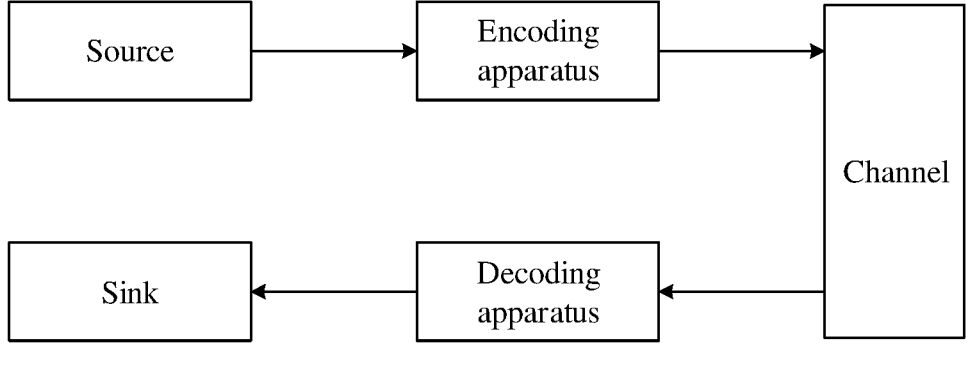
FIG. 1 is a block diagram of a structure of a communications system.

Before embodiments of this application are described in detail, application scenarios of embodiments of this application are first described. FIG. 1 is a block diagram of a structure of a communications system. At a transmit end, a source provides a to-be-sent data stream. An encoder receives the data stream, encodes the data stream to obtain codeword information obtained by combining a check bit and an information bit, and sends the codeword information. The codeword information is transmitted through a channel and arrives at a receive end. After the codeword information in which an error occurs due to noise or another damage on the channel is received at the receive end, a decoding apparatus decodes the codeword information to restore original data and send the original data to a sink. A decoding method provided in this application is applied to the decoding apparatus shown in FIG. 1, which is a quite important part in the communications system.

Figure 2:
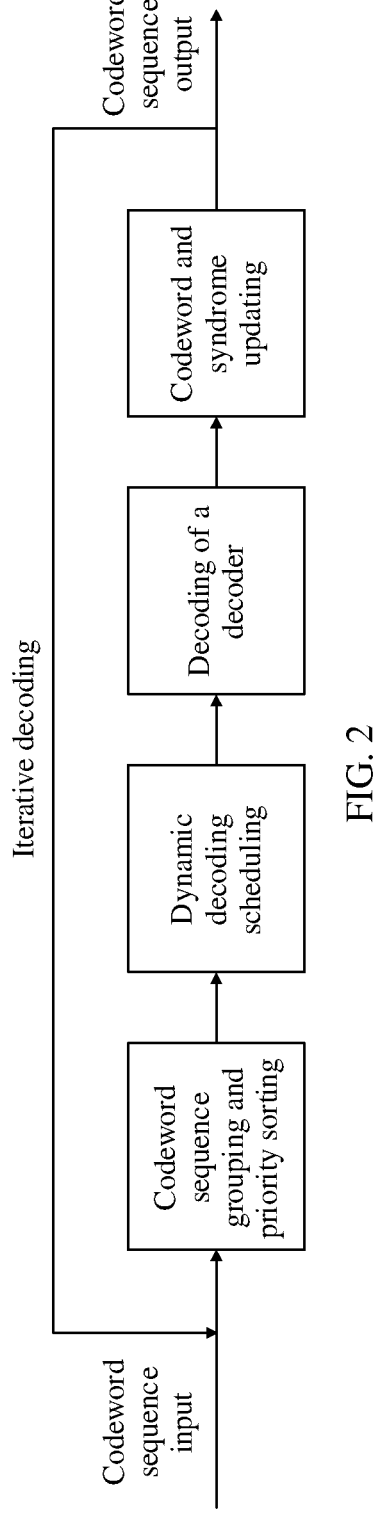
FIG. 2 is a diagram of a basic architecture of on-demand decoding according to this application.
Figure 3:
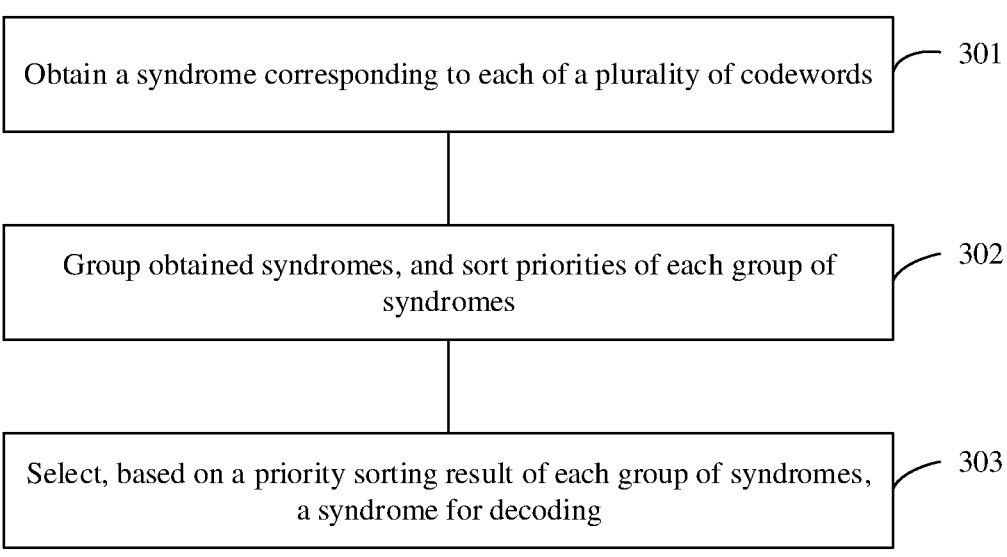
FIG. 3 is a flowchart of an on-demand decoding method according to this application.

The decoding method provided in this application is a dynamic on-demand decoding manner. A basic architecture of the decoding method is shown in FIG. 2. The decoding architecture includes codeword sequence grouping and priority sorting, dynamic decoding scheduling, decoding of a decoder, and codeword and syndrome (syndrome) updating. Specific steps of the method are shown in FIG. 3, and include the following steps.

301: Obtain a syndrome corresponding to each of a plurality of codewords. The syndrome is obtained based on a to-be-decoded codeword and a transpose of a parity check matrix. Generally, the syndrome is an inner product of the to-be-decoded codeword and the transpose of the parity check matrix, and is used to determine an error bit in a decoding process. An error may occur in codeword transmission because of interference. For example, if a sent codeword is A, and a received to-be-decoded codeword is B, a bit error is $E=A-B$, in other words, the to-be-decoded codeword is $B=A+E$. In this case, $S=B \cdot H^T$ is a syndrome, where H is a parity check matrix. Because a product of the original codeword and a transpose of the matrix H is 0,

9

$S=A \cdot H^{T}+E \cdot H^{T}=E \cdot H^{T}$. If the syndrome S is 0, no bit error occurs in transmission or the bit error E is a valid codeword, or if the syndrome S is a non-zero vector, a bit error occurs in transmission. A decoder may determine an error pattern (namely, a flip bit) based on the syndrome, and then flip a bit at a corresponding position in the to-be-decoded codeword to obtain a decoded codeword.

302: Group obtained syndromes, and sort priorities of each group of syndromes. For example, different syndromes have different numbers. Assuming that there are 100 syndromes, and the syndromes are numbered 1 to 100, and are divided into different groups. If all the syndromes are non-zero syndromes, priorities may be sorted in ascending order of the numbers in different groups. Further, a priority of a non-zero syndrome is higher than a priority of a syndrome whose value is 0. If there is a syndrome whose value is 0, priorities of non-zero syndromes are sorted in different groups in ascending order, and the syndrome whose value is 0 is ranked last. It should be understood that non-zero syndromes may be alternatively sorted in descending order or based on a sequence of 1, 3, 5, and the like. There may also be many priority sorting manners that meet a requirement. This is not limited in this application. In addition, the number may also be replaced with a storage address. A sorting method is the same, and details are not described again.

Specifically, it is assumed that there are 64 to-be-grouped syndromes, the syndromes are divided into four groups, syndromes 1 to 16, syndromes 17 to 32, syndromes 33 to 48, and syndromes 49 to 64 are divided into four groups, and priorities are sorted for each group in ascending order. During current decoding, if all the 64 syndromes are non-zero syndromes, priorities are sorted in ascending order, and syndromes with the highest priority in the groups are 1, 17, 33, and 49. If there is a syndrome whose value is 0, a priority of the syndrome is reduced. For example, if a value of the syndrome 1 is 0, and the other syndromes are non-zero syndromes, syndromes with the highest priority in the groups are 2, 17, 33, and 49. If the syndrome 2 is also 0, a priority of the syndrome 3 in the first group is the highest. If values of the syndromes 1 to 16 in this group are all 0, sorting is still performed based on a preset sequence.

Optionally, a priority of a non-zero syndrome decoded a large quantity of times is lower than a priority of a non-zero syndrome decoded a small quantity of times, in other words, when non-zero syndromes are sorted, a priority of a non-zero syndrome decoded a small quantity of times needs to be increased. For example, assuming that a group includes 16 syndromes, syndromes 1 to 5 are zero syndromes, and syndromes 6 to 16 are non-zero syndromes, where syndromes 10 to 16 are not decoded, and the other non-zero syndromes are decoded once, priorities of the syndromes 10 to 16 are higher than priorities of syndromes 6 to 9, and the priorities of the syndromes 6 to 9 are higher than priorities of the syndromes 1 to 5. In the three types of syndromes, if sorting is performed in ascending order of numbers, it can be learned that a priority sequence of the group is 10, 11, . . . , 16, 6, 7, . . . , 9, 1, 2, . . . , and 5.

It should be understood that in a case of hard decision, a syndrome whose value is 0 does not need to be decoded, and in a case of soft decision, each syndrome may be decoded regardless of whether a value of the syndrome is 0. Therefore, in the case of hard decision, if values of all syndromes in a group are 0, none of the syndromes in the group needs to be decoded. In addition, in the case of soft decision, only a quantity of decoding times may be alternatively considered. For example, a priority of a syndrome decoded a large quantity of times is lower than a priority of a syndrome decoded a small quantity of times regardless of whether a value of the syndrome is 0.

303: Select, based on a priority sorting result of each group of syndromes, a syndrome for decoding.

In this embodiment of this application, same decoding processing is not performed on all codewords, to avoid a problem that a same quantity of decoding times need to be performed regardless of whether codewords are correct in a conventional static decoding solution, thereby implementing on-demand decoding and reducing a decoding resource requirement and system power consumption.

It should be noted that parallel decoding may be used, in other words, a plurality of decoding units simultaneously perform decoding. A quantity of decoding processes performed in parallel is the same as a quantity of decoding units. If four decoding units exist, and four syndromes can be simultaneously decoded, the quantity of decoding processes performed in parallel is 4. In this case, no more than four syndromes are selected.

As described above, when hard decision decoding is performed on the obtained codeword, only a non-zero syndrome needs to be decoded; or when soft decision decoding is performed on the obtained codeword, a syndrome whose value is 0 may also need to be decoded, and a soft information amplitude corresponding to a bit included in each codeword is further obtained. In this case, in step 303, in addition to decoding the selected syndrome, a soft information amplitude corresponding to the syndrome needs to be decoded together.

It should be noted that generally, the soft information amplitude and a symbol bit are collectively referred to as soft information. The symbol bit is a value (0 or 1) of each bit in the codeword, and the soft information amplitude indicates a probability that each bit is 0 or 1, in other words, the soft information indicates a probability that a corresponding bit is 0 or 1.

Further, a quantity of syndromes included in each group is not limited. For example, 10 syndromes are divided into four groups, each of two groups may include three syndromes, and each of two groups may include two syndromes; or one group may include four syndromes, and each of the other three groups may include two syndromes. Optionally, all the groups include a same quantity of syndromes. In this way, the syndromes are most evenly grouped, so that complexity of priority sorting is reduced.

The decoding method in this application may be applied to a decoding apparatus that includes a plurality of decoding units. There are the following manners of selecting the syndrome for decoding.

(1) Syndromes are divided into n groups, where n is a positive integer not greater than a quantity of decoding processes performed in parallel. Optionally, n is the quantity of decoding processes performed in parallel, a maximum of one syndrome is selected from each group, and selected syndromes are separately sent to different decoding units for hard decision or soft decision decoding. Optionally, n is the quantity of decoding processes performed in parallel, one syndrome is selected from each group, and selected syndromes are separately sent to different decoding units for soft decision decoding.

Figure 4:
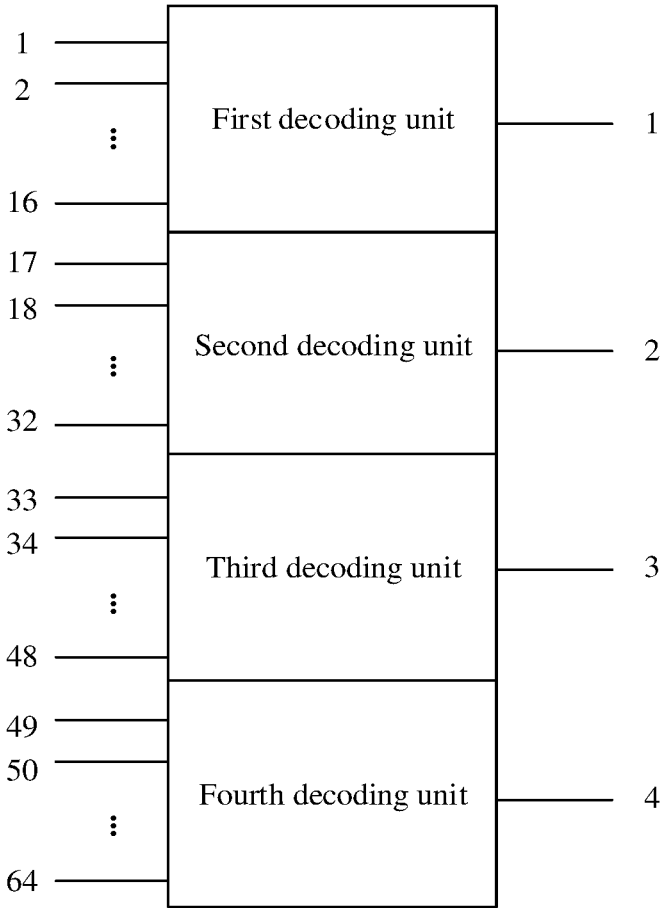
FIG. 4 is a diagram of a correspondence between each group of syndromes and a decoding unit according to this application.

In this embodiment of this application, assuming that there are 64 syndromes, and there are four decoding units that can perform parallel decoding, in other words, a quantity of decoding processes performed in parallel is 4, the 64 syndromes are divided into four groups (in other words, n=4), and each group includes 16 syndromes. As shown in FIG. 4, a maximum of one syndrome is selected from syndromes 1 to 16 and sent to a first decoding unit, a maximum of one syndrome is selected from syndromes 17 to 32 and sent to a second decoding unit, a maximum of one syndrome is selected from syndromes 33 to 48 and sent to a third decoding unit, and a maximum of one syndrome is selected from syndromes 49 to 64 and sent to a fourth decoding unit. The group-based selection manner has lower complexity than direct selection from the 64 syndromes. In addition, only the selected syndrome needs to be decoded, so that most unnecessary decoding operations are avoided, and power consumption is reduced. In addition, a storage unit of the syndrome only needs to be connected to a corresponding decoding unit. For example, a storage unit of the syndromes 1 to 16 only needs to be connected to the first decoding unit, and a storage unit of the syndromes 17 to 32 only needs to be connected to the second decoding unit. Therefore, connection complexity is reduced. Selection from all the groups may be performed in parallel, so that decoding time is further reduced.

It should be noted that when hard decision decoding is performed, and all syndromes in each group are 0, no syndrome is selected for decoding. Therefore, one syndrome may be selected from one group for decoding, or no syndrome is selected from one group for decoding. In the case of soft decision, one syndrome may be selected from each group for decoding. Certainly, a syndrome with the highest priority in the group is selected for decoding. In the following embodiments, the foregoing requirement also needs to be met regardless of whether a maximum of one syndrome is selected from each group or every two or more groups for decoding. Details are not repeated in this application.

(2) A maximum of one syndrome is selected from each group, and selected syndromes are separately sent to different decoding units for hard decision or soft decision decoding. Priorities of every two groups of syndromes are sorted again, a maximum of one syndrome is further selected from every two groups based on a sorting result, and selected syndromes are separately sent to different decoding units for hard decision or soft decision decoding. The syndromes selected two times are different, and all the selected syndromes are non-zero syndromes. Optionally, one syndrome is selected from each group, and selected syndromes are separately sent to different decoding units for soft decision decoding; and priorities of every two groups of syndromes are sorted again, one syndrome is selected from every two groups again based on a sorting result, and selected syndromes are separately sent to different decoding units for soft decision decoding. The syndromes selected two times are different. Specifically, the obtained syndromes are divided into 2n/3 groups, where n is not greater than a quantity of decoding processes performed in parallel, and n is an integer multiple of 3. Optionally, n is the quantity of decoding processes performed in parallel, and n is an integer multiple of 3. A maximum of one syndrome is selected, based on a priority sorting result, from each group for decoding, in other words, a maximum of 2n/3 syndromes are selected for decoding, and a maximum of one syndrome is further selected from every two groups based on a priority sorting result obtained again, in other words, a maximum of n/3 syndromes are selected for decoding. A total of no more than n syndromes are selected for decoding.

Figure 5:
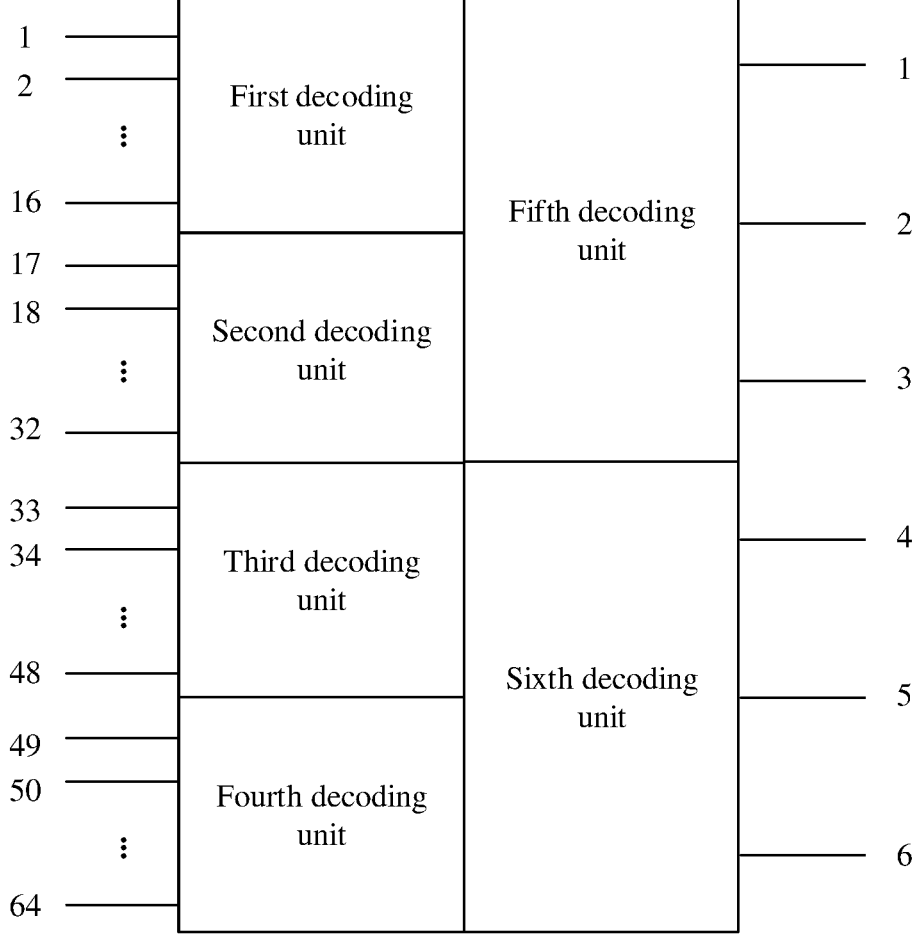
FIG. 5 is a diagram of another correspondence between each group of syndromes and a decoding unit according to this application.

For example, still assuming that there are 64 syndromes, and there are six decoding units that can perform parallel decoding, in this solution, the 64 syndromes are divided into four groups, and each group includes 16 syndromes. As shown in FIG. 5, a maximum of one syndrome is selected from syndromes 1 to 16 and sent to a first decoding unit, a maximum of one syndrome is selected from syndromes 17 to 32 and sent to a second decoding unit, a maximum of one syndrome is selected from syndromes 33 to 48 and sent to a third decoding unit, and a maximum of one syndrome is selected from syndromes 49 to 64 and sent to a fourth decoding unit. Then a maximum of one syndrome other than the selected syndromes is selected from syndromes 1 to 32 and sent to a fifth decoding unit, and a maximum of one syndrome other than the selected syndromes is selected from syndromes 33 to 64 and sent to a sixth decoding unit. The first decoding unit to the fourth decoding unit are first-stage decoding units, and the fifth decoding unit and the sixth decoding unit are second-stage decoding units. In this solution, it is ensured that a maximum of one syndrome is selected each time, and algorithm complexity is low. In addition, only the selected syndrome needs to be decoded, so that most unnecessary decoding operations are avoided, and power consumption is low. A storage unit of the syndrome also only needs to be connected to a corresponding decoding unit. For example, a storage unit of the syndromes 1 to 16 only needs to be connected to the first decoding unit and the fifth decoding unit, a storage unit of the syndromes 17 to 32 only needs to be connected to the second decoding unit and the fifth decoding unit, a storage unit of the syndromes 33 to 48 only needs to be connected to the third decoding unit and the sixth decoding unit, and a storage unit of the syndromes 49 to 64 only needs to be connected to the fourth decoding unit and the sixth decoding unit. Therefore, connection complexity is low.

In particular, the steps of selecting a maximum of one syndrome from each of the four groups may be performed in parallel, and the steps of separately selecting a maximum of one syndrome from the syndromes 1 to 32 and the syndromes 33 to 64 may also be performed in parallel, so that decoding time is further reduced.

(3) On the basis of Solution (1) in which there are only one-stage decoding units and Solution (2) in which there are two-stage decoding units, there may be alternatively three-stage decoding units. In this case, a maximum of one syndrome is selected from each group, and selected syndromes are separately sent to different decoding units for hard decision or soft decision decoding. Priorities of every two groups of syndromes are sorted again, a maximum of one syndrome is further selected from every two groups based on a sorting result, and selected syndromes are separately sent to different decoding units for hard decision or soft decision decoding. Then priorities of every four groups of syndromes are sorted, a maximum of one syndrome is selected from every four groups based on a sorting result, and selected syndromes are separately sent to different decoding units for hard decision or soft decision decoding. The syndromes selected three times are different. In addition, in the case of soft decision, when syndromes are selected from each group, every two groups, and every four groups, one syndrome is selected for soft decision decoding.

Specifically, a grouping manner may be as follows: The syndromes are divided into 4n/7 groups, where n is not greater than a quantity of decoding processes performed in parallel, and n is an integer multiple of 7. Optionally, n is equal to the quantity of decoding processes performed in parallel, and n is an integer multiple of 7. A maximum of one syndrome is selected, based on a priority sorting result, from each group for decoding, in other words, a maximum of 4n/7 syndromes are selected for decoding. Priorities of every two groups are sorted again, and a maximum of one syndrome is selected, based on a priority sorting result, from every two groups for decoding, in other words, a maximum of 2n/7 syndromes are selected for decoding. Priorities of every four groups are sorted again, and a maximum of one syndrome is selected based on a priority sorting result, in other words, a maximum of n/7 syndromes are selected again for decoding. There are no more than n syndromes for decoding in total. The syndromes selected three times are different.

Figure 6:
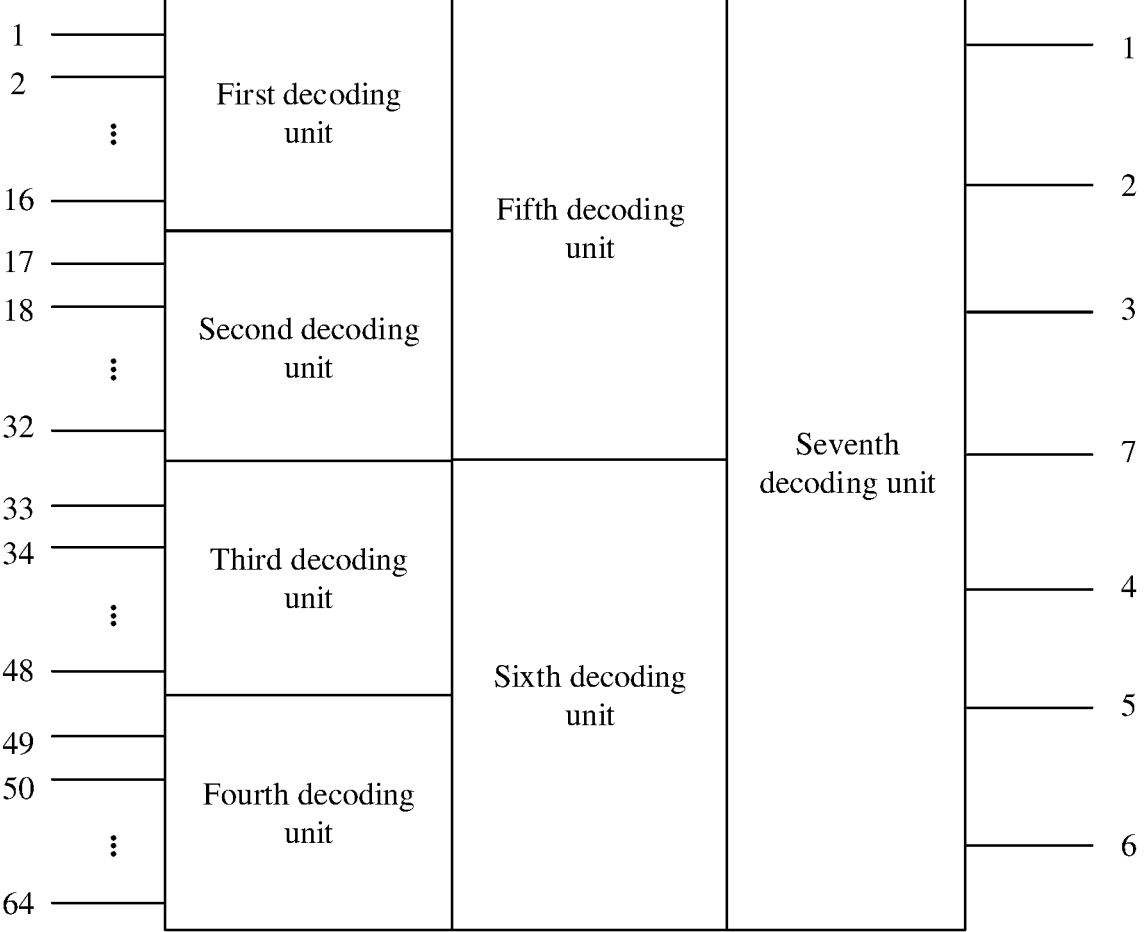
FIG. 6 is a diagram of another correspondence between each group of syndromes and a decoding unit according to this application.

For example, still assuming that there are 64 syndromes, and there are seven decoding units that can perform parallel decoding, in this solution, the 64 syndromes are divided into four groups, and each group includes 16 syndromes. As shown in FIG. 6, a maximum of one syndrome is selected from syndromes 1 to 16 and sent to a first decoding unit, a maximum of one syndrome is selected from syndromes 17 to 32 and sent to a second decoding unit, a maximum of one syndrome is selected from syndromes 33 to 48 and sent to a third decoding unit, and a maximum of one syndrome is selected from syndromes 49 to 64 and sent to a fourth decoding unit. The first decoding unit to the fourth decoding unit are first-stage decoding units. Then a maximum of one syndrome other than the selected syndromes is selected from syndromes 1 to 32 and sent to a fifth decoding unit, and a maximum of one syndrome other than the selected syndromes is selected from syndromes 33 to 64 and sent to a sixth decoding unit. The fifth decoding unit and the sixth decoding unit are second-stage decoding units. Then a maximum of one syndrome other than the selected syndromes is selected from the syndromes 1 to 64 and sent to a seventh decoding unit. The seventh decoding unit is a third-stage decoding unit.

In this solution, it can also be ensured that a maximum of one syndrome is selected each time, and relatively low algorithm complexity is ensured. In addition, only the selected syndrome needs to be decoded, so that most unnecessary decoding operations are avoided, and power consumption is low. A storage unit also only needs to be connected to a corresponding decoding unit, so that connection complexity is low. Compared with the first two solutions, decoding time is longer, but decoding performance is better.

In addition, steps of selecting, based on a priority sequence, a syndrome for decoding are divided into three level. At the first level, steps of selecting a maximum of one syndrome from each of four groups may be performed in parallel. At the second level, steps of separately selecting a maximum of one syndrome from the syndromes 1 to 32 and the syndromes 33 to 64 may also be performed in parallel. The last level is the third level at which a maximum of one syndrome is selected from the syndromes 1 to 64. Therefore, selection parallelism is improved, and decoding time is reduced.

The foregoing several solutions are merely several implementations provided in this application, and there may be another manner. For example, there are more levels, or when grouping is performed, all groups include different quantities of syndromes.

In addition, more than one syndrome may be alternatively selected from each group. For example, still assuming that there are 64 syndromes, and there are six decoding units that can perform parallel decoding, the 64 syndromes are divided into four groups, and each group includes 16 syndromes. In this case, a maximum of two syndromes may be selected from each of two groups for decoding, and a maximum of one syndrome may be selected from each of the other two groups for decoding. In this case, a storage unit of each of the two groups of syndromes is connected to two corresponding decoding units, and a storage unit of each of the other two groups of syndromes is connected to one corresponding decoding unit. Alternatively, a maximum of three syndromes are selected from one group for decoding, and a maximum of one syndrome is selected from each of the other three groups for decoding. In this case, a storage unit of the one group of syndromes is connected to three corresponding decoding units, and a storage unit of each of the other three syndromes is connected to one corresponding decoding unit. In addition, one syndrome may be alternatively selected from each group, and then two syndromes may be selected from three groups of syndromes, or two syndromes may be selected from two groups of syndromes. A total of six syndromes are obtained for decoding. There are a plurality of similar selection manners, and all of the manners fall within the protection scope of this application.

Further, in the case of soft decision, a syndrome needs to be decoded regardless of whether the syndrome is 0, and there is no syndrome that does not need to be decoded. In this case, a selection manner is as follows: Two syndromes are selected from each of two groups for decoding, and one syndrome is selected from each of the other two groups for decoding, or three syndromes are selected from one group for decoding, and one syndrome is selected from each of the other three groups for decoding. In addition, if multi-stage decoding units exist, and Solution (2), for example, is used, more than one syndrome may be alternatively selected from every two groups.

Optionally, at a next decoding moment, a preset priority sequence in each group is different from a priority sequence at a current decoding moment. For example, during current decoding, assuming that a priority sequence in each group is 1, 2, 3, . . . , at the next decoding moment, a priority sequence may be changed to 2, 3, 4, . . . , and 1, and has a cyclic shift relationship with the priority sequence at the current decoding moment. Optionally, at any decoding moment, a priority of a non-zero syndrome is higher than a priority of a syndrome whose value is 0.

Specifically, assuming that there are 64 syndromes, and syndromes 1 to 16, 17 to 32, 33 to 48, and 49 to 64 are divided into four groups. During the current decoding, syndromes 1, 17, 33, and 49 are selected, based on sequences of (1, 2, . . . , and 16), (17, 18, . . . , and 32), (33, 34, . . . , and 48), and (49, 50, . . . , and 64), for decoding. At the next decoding moment, there are 64 syndromes that are not completely the same as the previous syndromes, the syndromes are still numbered 1 to 64, syndromes 1 to 16, 17 to 32, 33 to 48, and 49 to 64 are also divided into four groups, priority sequences are changed to (2, 3, . . . , 16, and 1), (18, 19, . . . , 32, and 17), (34, 35, . . . , 48, and 33), (50, 51, . . . , 64, and 49), syndromes 2, 18, 34, and 50 are selected for decoding, and so on. In addition, assuming that syndromes 1 to 3 and 17 to 20 are zero syndromes during the current decoding, syndromes 4, 21, 33, and 49 are selected, based on the same priority sequences and a priority sorting manner in which a priority of a non-zero syndrome is higher than a priority of a zero syndrome, for decoding. At the next decoding moment, in the 64 syndromes, syndromes 4 to 6 and 18 are zero syndromes, and syndromes 2, 19, 34, and 50 are selected, based on changed priority sequences and the manner in which a priority of a non-zero syndrome is higher than a priority of a zero syndrome, for decoding.

Certainly, at the two decoding moments, priority sequences for selecting a maximum of one syndrome from each group may not follow a cyclic shift relationship. For example, under the condition that a priority of a non-zero syndrome is higher than a priority of a zero syndrome, a priority sequence of non-zero syndromes is randomly set each time. This is not specifically limited in this application.

It should be understood that the syndrome corresponding to each of the plurality of obtained codewords may be selected from syndromes stored in a memory. For example, a quantity of a plurality of obtained syndromes is 64, the memory includes 64 storage units, and one syndrome is selected from each storage unit to obtain 64 syndromes. Certainly, alternatively, there may be 32 storage units, and two syndromes may be selected from each storage unit. This is not specifically limited in this application. In addition, at the two decoding moments, obtained syndromes may be different. To be specific, during next decoding, 64 new syndromes may be obtained, and the selected syndromes may be completely the same as the previous syndromes, may be partially different from the previous syndromes, or even may be completely different from the previous syndromes.

When the selected syndromes are decoded, taking one of the syndromes (a first syndrome) as an example, if the decoding fails, no operation is performed, or a corresponding soft information amplitude is updated; or if the decoding succeeds, the first syndrome and a codeword corresponding to the first syndrome are updated based on a decoding result.

If hard decision decoding is performed on the obtained codewords, the decoding result includes a delta syndrome corresponding to the first syndrome and a flip bit, the delta syndrome and the first syndrome are superimposed to obtain an updated syndrome, and the original first syndrome is replaced with the updated syndrome. Then a bit that is in the corresponding codeword and that corresponds to the flip bit is flipped based on the flip bit. Assuming that the codeword corresponding to the first syndrome includes 100 bits, and the flip bit indicates the 30th bit, the 30th bit in the codeword is flipped, that is, 0 is changed to 1, or 1 is changed to 0.

If soft decision decoding is performed on the obtained codewords, soft information amplitudes corresponding to the syndromes are also decoded together. For the first syndrome, if the decoding succeeds, a delta syndrome corresponding to the first syndrome, a flip bit, and an updated soft information amplitude are obtained. The delta syndrome and the first syndrome are superimposed to obtain an updated syndrome, and the original first syndrome is replaced with the updated syndrome. A bit that is in the corresponding codeword and that corresponds to the flip bit is flipped based on the flip bit. The original soft information amplitude is replaced with the updated soft information amplitude to complete the decoding.

There are several different mechanisms for outputting a codeword and a corresponding syndrome. For example, all syndromes have same storage time. In other words, each syndrome can be stored in a storage unit only for fixed time. Assuming that the fixed time is two microseconds, after the storage time reaches two microseconds, the syndrome is overwritten with a newly received syndrome. Similarly, codewords corresponding to the syndromes also have same storage time. For another example, to-be-decoded time of all the syndromes is the same. Assuming that the to-be-decoded time is one microsecond, when storage time of the syndrome reaches one microsecond, regardless of whether the syndrome is decoded, an address of the syndrome is considered as an invalid address, and the syndrome is no longer decoded and is overwritten with a newly stored syndrome.

When it is ensured that the storage time or the to-be-decoded time is the same, a quantity of times of decoding the syndrome may be further limited. For example, if a threshold for the quantity of decoding times is set to 3, each syndrome is decoded a maximum of three times, and if a syndrome is decoded three times, the syndrome is not selected for decoding. In addition, the storage time or the to-be-decoded time may not be limited, and only the quantity of decoding times is limited. Provided that a quantity of times of decoding a syndrome reaches a threshold, an address of the syndrome is considered as an invalid address until the syndrome is overwritten with a newly stored syndrome, and a corresponding codeword is output from a corresponding storage unit.

Embodiments of this application further simulate decoding performance by using, as an example, space-coupled Bose-Chaudhuri-Hocquenghem (Bose-Chaudhuri-Hocquenghem, BCH) codes whose code rate is 444/484=0.917. 64 cyclic BCH (968, 928) codes that have a code length of 968 and an information length of 928 and that can correct 4 bits are constructed by using the BCH code whose code rate is 0.917. In other words, each codeword includes 968 information bits and 40 check bits. Half of bits in each BCH (968, 928) code are from a previously formed codeword. Then, after syndromes (a total of 64 syndromes) corresponding to all codewords are obtained, a maximum of six non-zero syndromes are selected, in the manner of Solution (2) in the foregoing embodiment, for hard decision decoding. A result indicates that when an input bit error rate is 6.05E-3, a bit error rate (also referred to as an output bit error rate) of decoding performed by using the dynamic decoding solution provided in this application is approximately 1E-15, and performance meets a requirement. In addition, algorithm complexity of this solution is low. Only the selected syndrome needs to be decoded, so that most unnecessary decoding operations are avoided, and power consumption is low. In addition, a storage unit does not need to be connected to all decoding units, so that connection complexity is also low.

Another embodiment of this application provides a storage load balancing solution. Syndromes corresponding to a first frame are stored in groups. Quantities of syndromes that correspond to the first frame and that are stored in the groups differ by a maximum of one, and the first frame includes a plurality of codewords. Optionally, a same quantity of syndromes corresponding to codewords from a same frame are stored in the groups. The following describes an example in which a same quantity of syndromes corresponding to codewords from a same frame are stored in the groups.

Figures 7, 8:
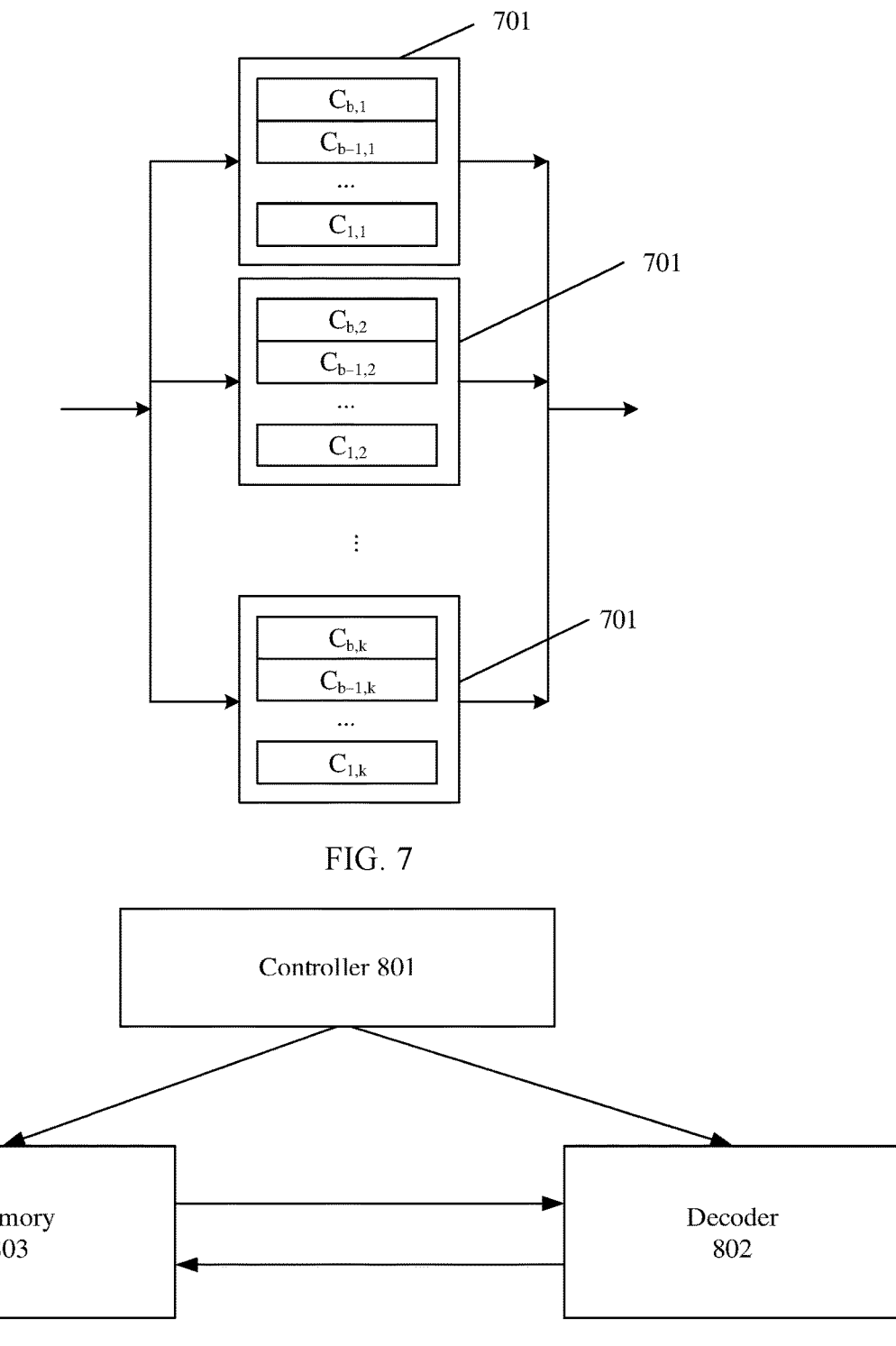
FIG. 7 is a diagram of a correspondence between a syndrome and a storage unit according to this application.
FIG. 8 is a diagram of an on-demand decoding apparatus according to this application.

For example, one data frame includes k codewords, each codeword corresponds to one syndrome, syndromes corresponding to the codewords in the data frame are stored in k groups, and each group stores one syndrome. A decoding window length of a decoder is b frames, and both k and b are positive integers. In this case, a storage unit needs to store a total of k*b syndromes. In a load balancing solution, a total of k storage units exist. As shown in FIG. 7, $C_{i,j}$ represents a syndrome of the $j^{th}$ codeword in the $i^{th}$ frame, i=1, 2, . . . , and b, and j=1, 2, . . . , and k. The $j^{th}$ storage unit 701 stores syndromes of the $j^{th}$ codeword in different frames, and a frame number is incremented from 1 to b. Assuming that a frame number of a current input frame is 1, because a codeword included in the current frame includes a largest quantity of bit errors, a largest quantity of decoding and storage updating times are required. In this solution, syndromes corresponding to all codewords in the current frame 1 are evenly distributed on all storage units 701. Similarly, syndromes corresponding to all codewords in the second frame, the third frame, . . . , and the $b^{th}$ frame are also evenly distributed on all the storage units 701. Because the second frame, the third frame, . . . , and the $b^{th}$ frame have less bit errors than the first frame, a smaller quantity of decoding and storage updating times are required. Load processed by each storage unit 701 is an average value of storage load in the decoding window length of b frames. Therefore, this design ensures that all the storage units 701 have substantially consistent load, to balance thermal densities and avoid local overheating.

In addition, a quantity of groups for group-based storage may be alternatively different from a quantity of codewords included in a data frame. For example, if each data frame includes 11 codewords, and the 11 codewords are stored in 10 groups, one group needs to store syndromes corresponding to two codewords, and each of the other nine groups stores a syndrome corresponding to one codeword, to ensure even storage and avoid high local power consumption. It should be understood that codeword storage may also meet the foregoing condition, to ensure even storage of codewords included in each frame and reduce local power consumption.

In the on-demand decoding solution provided in the foregoing embodiment, a correspondence between a storage unit and a decoding unit of a syndrome is implemented. Therefore, decoding load of the decoding unit is also an average value of decoding load in the decoding window length of a total of b frames. Because quantities of decoding processes in which all decoding units participate are balanced, power consumption generated on chip areas of the decoding units are also similar, so that a thermal density balance level can be greatly increased, and a chip implementation engineering difficulty can be reduced.

This application provides a decoding apparatus. As shown in FIG. 8, the apparatus includes a controller 801 and a decoder 802. The controller 801 is configured to: obtain a syndrome corresponding to each of a plurality of codewords, and group obtained syndromes, and is further configured to: sort priorities of each group of syndromes, select a syndrome based on a priority sorting result of each group of syndromes, and send the syndrome to the decoder 802. The decoder 802 is configured to decode the received syndrome.

In the decoding apparatus disclosed in this embodiment of this application, same decoding processing is not performed on all codewords, to avoid a problem that a same quantity of decoding times need to be performed regardless of whether codewords are correct in a conventional decoding solution, thereby implementing on-demand decoding and reducing a decoding resource requirement and system power consumption.

Optionally, a priority of a non-zero syndrome is higher than a priority of a syndrome whose value is 0. Further, a priority of a non-zero syndrome decoded a large quantity of times is lower than a priority of a non-zero syndrome decoded a small quantity of times, in other words, when non-zero syndromes are sorted, a priority of a non-zero syndrome decoded a small quantity of times needs to be increased, and a syndrome decoded a smaller quantity of times has a higher priority. A specific example is described in the foregoing method embodiments, and details are not repeated in this embodiment of this application. In addition, there are a plurality of manners of selecting the syndrome for decoding. The manners have been described in detail in the foregoing method embodiments, and details are not repeated in this embodiment.

Further, a quantity of syndromes included in each group is not limited. For example, 10 syndromes are divided into four groups, each of two groups may include three syndromes, and each of two groups may include two syndromes; or one group may include four syndromes, and each of the other three groups may include two syndromes.

Optionally, all the groups include a same quantity of syndromes. In this way, the syndromes are most evenly grouped, so that complexity of priority sorting is reduced.

When hard decision decoding is performed on the obtained codewords, only a non-zero syndrome needs to be decoded. When soft decision decoding is performed on the obtained codewords, a syndrome whose value is 0 may also need to be decoded, and the decoding apparatus further receives a soft information amplitude corresponding to a bit included in each codeword. In this case, in addition to sending the selected syndrome to the decoder 802 for decoding, the controller 801 needs to send a soft information amplitude corresponding to the selected syndrome to the decoder 802 together. Generally, the soft information amplitude and a symbol bit are collectively referred to as soft information. The symbol bit is a value (0 or 1) of each bit in the codeword, and the soft information amplitude indicates a probability that each bit is 0 or 1, in other words, the soft information indicates a probability that a corresponding bit is 0 or 1.

Optionally, at a next decoding moment, a preset priority sequence in each group is different from a priority sequence at a current decoding moment. For example, during current decoding, assuming that a priority sequence in each group is 1, 2, 3, . . . , at the next decoding moment, a priority sequence may be changed to 2, 3, 4, . . . , and 1, and has a cyclic shift relationship with the priority sequence at the current decoding moment. Optionally, at any decoding moment, a priority of a non-zero syndrome is higher than a priority of a syndrome whose value is 0.

Specifically, assuming that there are 64 syndromes, and syndromes 1 to 16, 17 to 32, 33 to 48, and 49 to 64 are divided into four groups. During the current decoding, syndromes 1, 17, 33, and 49 are selected, based on sequences of (1, 2, . . . , and 16), (17, 18, . . . , and 32), (33, 34, . . . , and 48), and (49, 50, . . . , and 64), for decoding. At the next decoding moment, there are 64 syndromes that are not completely the same as the previous syndromes, the syndromes are still numbered 1 to 64, syndromes 1 to 16, 17 to 32, 33 to 48, and 49 to 64 are also divided into four groups, priority sequences are changed to (2, 3, . . . , 16, and 1), (18, 19, . . . , 32, and 17), (34, 35, . . . , 48, and 33), (50, 51, . . . , 64, and 49), syndromes 2, 18, 34, and 50 are selected for decoding, and so on. In addition, assuming that syndromes 1 to 3 and 17 to 20 are zero syndromes during the current decoding, syndromes 4, 21, 33, and 49 are selected, based on the same priority sequences and a priority sorting manner in which a priority of a non-zero syndrome is higher than a priority of a zero syndrome, for decoding. At the next decoding moment, in the 64 syndromes, syndromes 4 to 6 and 18 are zero syndromes, and syndromes 2, 19, 34, and 50 are selected, based on changed priority sequences and the manner in which a priority of a non-zero syndrome is higher than a priority of a zero syndrome, for decoding.

Certainly, at the two decoding moments, priority sequences for selecting a maximum of one syndrome from each group may not follow a cyclic shift relationship. For example, under the condition that a priority of a non-zero syndrome is higher than a priority of a zero syndrome, a priority sequence of non-zero syndromes is randomly set each time. This is not specifically limited in this application.

Generally, the decoding apparatus further includes a memory 803, and the syndrome corresponding to each of the plurality of obtained codewords may be selected from syndromes stored in the memory 803. For example, a quantity of a plurality of obtained syndromes is 64, the memory 803 includes 64 storage units, and one syndrome is selected from each storage unit to obtain 64 syndromes. Certainly, alternatively, there may be 32 storage units, and two syndromes may be selected from each storage unit. This is not specifically limited in this application. The storage units may be at different locations in a same memory or a plurality of memories. Alternatively, one memory is one storage unit. This is not limited in this application.

Further, at the two decoding moments, obtained syndromes may be different. To be specific, during next decoding, 64 new syndromes may be obtained, and the selected syndromes may be completely the same as the previous syndromes, may be partially different from the previous syndromes, or even may be completely different from the previous syndromes.

When the decoder 802 decodes received syndromes, if the decoding succeeds, a first syndrome and a codeword corresponding to the first syndrome are updated based on a decoding result; or if the decoding fails, no operation is performed.

The decoder 802 performs hard decision decoding on the received syndromes. Taking one of the syndromes (the first syndrome) as an example, if the decoding succeeds, the decoder 803 obtains a delta syndrome corresponding to the first syndrome and a flip bit, and then sends the delta syndrome and the flip bit to the memory 803. The controller 801 is configured to superimpose the delta syndrome and the first syndrome, so that the memory 803 stores an updated syndrome, and is further configured to flip, based on the flip bit, a bit that is in the corresponding codeword and that corresponds to the flip bit, so that the memory 803 stores an updated bit. Assuming that the codeword corresponding to the first syndrome includes 100 bits, and the flip bit indicates the 30th bit, the controller 801 flips the 30th bit in the codeword, that is, changes 0 to 1 or changes 1 to 0.

If the decoder 802 performs soft decision decoding on the received syndromes, the decoder 802 needs to decode a soft information amplitude corresponding to the syndrome together. For the first syndrome, if decoding succeeds, a delta syndrome corresponding to the first syndrome, a flip bit, and an updated soft information amplitude are obtained, and the delta syndrome, the flip bit, and the updated soft information amplitude are sent to the memory 803. The controller 801 is configured to: superimpose the delta syndrome and the first syndrome, so that the memory 803 stores an updated syndrome, and flip, based on the flip bit, a bit that is in the corresponding codeword and that corresponds to the flip bit, so that the memory 803 stores an updated bit.

It should be noted that the memory 803 may include different storage units, for example, a syndrome storage unit, a data storage unit, and a soft information storage unit, respectively configured to store a syndrome, a codeword, and corresponding soft information.

Figure 9:
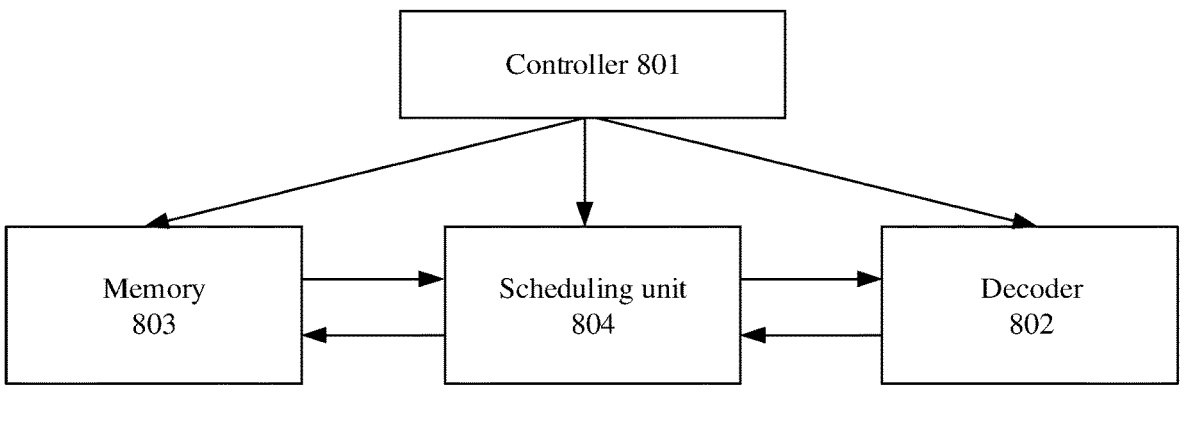
FIG. 9 is a diagram of another on-demand decoding apparatus according to this application.

Optionally, the decoding apparatus further includes a scheduling unit 804. As shown in FIG. 9, main functions of the scheduling unit 804 include: sending a syndrome in the memory 803 to the decoder 802 based on an indication of the controller 801, and sending, to the memory 803, a delta syndrome and a flip bit that are output by the decoder 802. For soft decision decoding, the scheduling unit 804 further sends a soft information amplitude in the memory 803 to the decoder 802 based on an indication of the controller 801, and sends, to the memory 803, the soft information amplitude output by the decoder 802.

In particular, in actual implementation, to reduce power consumption, bandwidth of the scheduling unit 804 may be limited. For example, a quantity of delta syndromes and a quantity of flip bits that are sent to the memory 803 at each moment are limited to not exceed specific thresholds. In this case, the scheduling unit 804 buffers a delta syndrome and a flip bit beyond the thresholds, and then sends the delta syndrome and the flip bit to the memory at a next moment.

There are several different mechanisms for outputting a codeword and a corresponding syndrome. For example, all syndromes have same storage time. In other words, each syndrome can be stored in the memory 803 only for fixed time. Assuming that the fixed time is two microseconds, after the storage time reaches two microseconds, the syndrome is overwritten with a newly received syndrome. Similarly, codewords corresponding to the syndromes also have same storage time. For another example, to-be-decoded time of all the syndromes is the same. Assuming that the to-be-decoded time is one microsecond, when storage time of the syndrome reaches one microsecond, regardless of whether the syndrome is decoded, an address of the syndrome is considered as an invalid address, and the syndrome is no longer decoded and is overwritten with a newly stored syndrome.

When it is ensured that the storage time or the to-be-decoded time is the same, a quantity of times of decoding the syndrome may be further limited. For example, if a threshold for the quantity of decoding times is set to 3, each syndrome is decoded a maximum of three times, and if a syndrome is decoded three times, the syndrome is not selected for decoding. In addition, the storage time or the to-be-decoded time may not be limited, and only the quantity of decoding times is limited. Provided that a quantity of times of decoding a syndrome reaches a threshold, an address of the syndrome in the memory 803 is considered as an invalid address until the syndrome is overwritten with a newly stored syndrome, and a corresponding codeword is also output from the corresponding memory.

Optionally, the memory includes a plurality of storage units, quantities of syndromes that correspond to a first frame and that are stored in the storage units differ by a maximum of one, to implement even storage, and the first frame includes a plurality of codewords. Further, a same quantity of syndromes corresponding to codewords from a same frame are stored in the storage units. The following describes an example in which a same quantity of syndromes corresponding to codewords from a same frame are stored in the storage units.

It is assumed that a decoding window length of the decoder 802 is b frames, each data frame includes k codewords, and both k and b are positive integers. In this case, the memory 803 needs to store a total of k*b syndromes. This embodiment of this application provides a load balancing solution. The memory includes k storage units each having a size of b. As shown in FIG. 6, $C_{i,j}$ represents codeword information of the $j^{th}$ codeword in the $i^{th}$ frame, i=1, 2, . . . , and b, and j=1, 2, . . . , and k. The $j^{th}$ storage unit stores syndromes of the $j^{th}$ codeword in different frames, and a frame number is incremented from 1 to b. Assuming that a frame number of a current input frame is 1, because a codeword included in the current frame includes a largest quantity of bit errors, a largest quantity of decoding and storage updating times are required. In this solution, syndromes corresponding to all codewords in the current frame 1 are evenly distributed on all storage units. Similarly, syndromes corresponding to all codewords in the second frame, the third frame, . . . , and the $b^{th}$ frame are also evenly distributed on all the storage units. Because the second frame, the third frame, . . . , and the $b^{th}$ frame have less bit errors than the first frame, a smaller quantity of decoding and storage updating times are required. Load processed by each storage unit is an average value of storage load in the decoding window length of n frames. Therefore, this design ensures that all the storage units have substantially consistent load, to balance thermal densities and avoid local overheating.

In addition, a quantity of storage units may be alternatively different from a quantity of codewords included in a data frame. For example, if each data frame includes 100 codewords, and there are 10 storage units, each storage unit stores syndromes corresponding to 10 codewords in the data frame. If each data frame includes 11 codewords, and there are still 10 storage units, one of the storage units stores syndromes corresponding to two codewords, and each of the other nine storage units stores a syndrome corresponding to one codeword. In this embodiment, even storage can be ensured, and high local power consumption can be avoided. It should be understood that the received codeword and syndrome are stored in different storage units, and the codeword may also be stored according to the foregoing syndrome storage solution. If soft decision is performed, a soft information amplitude corresponding to each bit in the codeword is further received, and the soft information amplitude may also be stored according to the foregoing syndrome storage solution.

In the on-demand decoding solution provided in the foregoing embodiment, a correspondence between a storage unit storing a syndrome and a decoding unit is implemented. Therefore, decoding load of the decoding unit is also an average value of decoding load in the decoding window length of a total of b frames. Because quantities of decoding processes in which all decoding units participate are balanced, power consumption generated on chip areas of the decoding units are also similar, so that a thermal density balance level can be greatly increased, and a chip implementation engineering difficulty can be reduced.

It should be noted that the decoding apparatus involved in this application may include an application specific integrated circuit (Application Specific Integrated Circuit, ASIC) and a field programmable gate array (Field Programmable Gate Array, FPGA). All the functional components, including the memory, the scheduling unit, and the like, may be implemented by ASICs or FPGAs, and finally constitute the decoding apparatus.

An embodiment of this application provides a computer-readable storage medium or a computer program product, configured to store a computer program. The computer program is used to perform the decoding method disclosed in the method embodiments of this application.

"An embodiment" or "an embodiment" mentioned in the whole specification does not mean that particular features, structures, or characteristics related to the embodiment are included in at least one embodiment of the present invention. Therefore, "in an embodiment" or "in an embodiment" appearing throughout the specification does not refer to a same embodiment. In addition, these particular features, structures, or characteristics may be combined in one or more embodiments in any appropriate manner. It should be understood that sequence numbers of the foregoing processes do not mean execution sequences in various embodiments of the present invention. The execution sequences of the processes should be determined according to functions and internal logic of the processes, and should not be construed as any limitation on the implementation processes of embodiments of the present invention.

In the several embodiments provided in this application, it should be understood that the disclosed apparatuses and methods may be implemented in other manners. For example, the described apparatus embodiment is merely an example. For example, division into the units is merely logical function division and may be other division in actual implementation. For example, a plurality of units or components may be combined or integrated into another system, or some features may be ignored or not performed.

In addition, functional units in embodiments of the present invention may be integrated into one processing unit, or each of the units may exist alone physically, or two or more units are integrated into one unit. The integrated unit may be implemented in a form of hardware, or may be implemented in a form of a software function unit.

In summary, what is described above is merely example embodiments of the technical solutions of the present invention, but is not intended to limit the protection scope of the present invention. Any modification, equivalent replacement, or improvement made without departing from the spirit and principle of the present invention shall fall within the protection scope of the present invention.

What is claimed is:

1. A decoding method, comprising:

receiving a plurality of codewords transmitted by an encoding apparatus through a communication channel;

obtaining a plurality of syndromes, each of the plurality of syndromes corresponding to one of the plurality of codewords, wherein the plurality of syndromes are in a plurality of groups of syndromes, the plurality of groups of syndromes are n groups of syndromes, n is a positive integer not greater than a quantity of decoding processes performed in parallel, and each of the plurality of syndromes has a corresponding priority; and for each group of the plurality of groups of syndromes, identifying a syndrome from syndromes in the group for decoding based on priorities of the syndromes in the group, wherein identifying the syndrome for each group of the plurality of groups of syndromes comprises:

identifying a first syndrome from a plurality of first syndromes in a first group of the plurality of groups based on a plurality of first priorities of the plurality of first syndromes in the first group; and identifying a second syndrome from a plurality of second syndromes in a second group of the plurality of groups based on a plurality of second priorities of the plurality of second syndromes in the second group.

2. The decoding method according to claim 1, wherein a priority of a non-zero syndrome is higher than a priority of a syndrome whose value is 0.

3. The decoding method according to claim 1, wherein a priority of a non-zero syndrome decoded a large quantity of times is lower than a priority of a non-zero syndrome decoded a small quantity of times.

4. The decoding method according to claim 1, wherein the decoding method is applied to a decoding apparatus that comprises a plurality of decoding units; and wherein the method comprises:

obtaining selected syndromes by selecting a maximum of one syndrome from each group of the plurality of groups of syndromes; and separately sending the selected syndromes to different decoding units for hard decision or soft decision decoding, wherein all the selected syndromes are non-zero syndromes.

5. The decoding method according to claim 1, wherein the decoding method is applied to a decoding apparatus that comprises a plurality of decoding units; and wherein the method comprises:

obtaining selected syndromes by selecting one syndrome from each group of the plurality of groups of syndromes; and separately sending the selected syndromes to different decoding units for soft decision decoding.

6. The decoding method according to claim 4, wherein a quantity of groups of the plurality of groups of syndromes is the same as a quantity of decoding units.

7. The decoding method according to claim 1, wherein the decoding method is applied to a decoding apparatus that comprises a plurality of decoding units; and wherein the method comprises:

obtaining first selected syndromes by selecting a maximum of one syndrome from each group of the plurality of groups of syndromes;

separately sending the first selected syndromes to different decoding units for hard decision or soft decision decoding;

sorting priorities of every two groups of syndromes;

obtaining second selected syndromes by selecting a maximum of one syndrome from every two groups based on a sorting result; and separately sending the second selected syndromes to different decoding units for hard decision or soft decision decoding, wherein the first selected syndromes and the second selected syndromes are different, and all the first selected syndromes and the second selected syndromes are non-zero syndromes.

8. The decoding method according to claim 1, wherein the decoding method is applied to a decoding apparatus that comprises a plurality of decoding units; and wherein the method comprises:

obtaining first selected syndromes by selecting one syndrome from each group of the plurality of groups of syndromes;

separately sending the first selected syndromes to different decoding units for soft decision decoding;

sorting priorities of every two groups of syndromes;

obtaining second selected syndromes by selecting one syndrome from every two groups based on a sorting result; and separately sending the second selected syndromes to different decoding units for soft decision decoding, wherein the first selected syndromes and the second selected syndromes are different.

9. The decoding method according to claim 7, wherein the plurality of groups of syndromes are 2/3n groups, n is a quantity of decoding units, and n is an integer multiple of 3.

10. The decoding method according to claim 1, wherein all groups comprise a same quantity of syndromes.

11. The decoding method according to claim 1, wherein after decoding the identified syndromes, the method further comprises:

sorting priorities of each group of the plurality of groups of syndromes again; and selecting, based on a current priority sorting result, a maximum of one syndrome from each group of the plurality of groups of syndromes for decoding.

12. The decoding method according to claim 11, wherein in the two sorting the priorities of each group of the plurality of groups of syndromes, priority sorting methods are different.

13. The decoding method according to claim 1, wherein the method further comprises:

if a first syndrome is successfully decoded, obtaining a delta syndrome corresponding to the first syndrome and a flip bit, wherein the first syndrome is one of syndromes for decoding;

superimposing the delta syndrome and the first syndrome to obtain an updated syndrome; and flipping, based on the flip bit, a bit that is in a corresponding codeword and that corresponds to the flip bit.

14. The decoding method according to claim 1, wherein all syndromes have same storage time.

15. The decoding method according to claim 1, wherein the method further comprises:

storing, in groups, syndromes corresponding to a first frame, wherein quantities of syndromes that correspond to the first frame and that are stored in the groups differ by a maximum of one, and the first frame comprises a plurality of codewords.

16. A decoding apparatus, comprising a receiver, a controller, and a decoder, wherein:

the receiver is configured to receive a plurality of codewords transmitted by an encoding apparatus through a communication channel; and the controller is configured to:

obtain a plurality of syndromes, each of the plurality of syndromes corresponding to one of the plurality of codewords, wherein the plurality of syndromes are in a plurality of groups of syndromes, the plurality of groups of syndromes are n groups of syndromes, n is a positive integer not greater than a quantity of decoding processes performed in parallel, and each of the plurality of syndromes has a corresponding priority;

for each group of the plurality of groups of syndromes, identify a syndrome from syndromes in the group for decoding based on priorities of the syndromes in the group, wherein identifying the syndrome for each group of the plurality of groups of syndromes comprises:

identifying a first syndrome from a plurality of first syndromes in a first group of the plurality of groups based on a plurality of first priorities of the plurality of first syndromes in the first group; and identifying a second syndrome from a plurality of second syndromes in a second group of the plurality of groups based on a plurality of second priorities of the plurality of second syndromes in the second group; and send the identified syndromes to the decoder.

17. The decoding apparatus according to claim 16, wherein a priority of a non-zero syndrome is higher than a priority of a syndrome whose value is 0.

18. The decoding apparatus according to claim 16, wherein a priority of a non-zero syndrome decoded a large quantity of times is lower than a priority of a non-zero syndrome decoded a small quantity of times.

19. A non-transitory computer-readable storage medium, wherein the non-transitory computer-readable storage medium stores instructions which, when executed by one or more processors of a terminal device, cause the terminal device to perform operations comprising:

receiving a plurality of codewords transmitted by an encoding apparatus through a communication channel;

obtaining a plurality of syndromes, each of the plurality of syndrome corresponding to one of the plurality of codewords, wherein the plurality of syndromes are in a plurality of groups of syndromes, the plurality of groups of syndromes are n groups of syndromes, n is a positive integer not greater than a quantity of decoding processes performed in parallel, and each of the plurality of syndromes has a corresponding priority; and for each group of the plurality of groups of syndromes,
identifying a syndrome from syndromes in the group for decoding based on priorities of the syndromes in the group, wherein identifying the syndrome for each group of the plurality of groups of syndromes comprises:

identifying a first syndrome from a plurality of first syndromes in a first group of the plurality of groups based on a plurality of first priorities of the plurality of first syndromes in the first group; and identifying a second syndrome from a plurality of second syndromes in a second group of the plurality of groups based on a plurality of second priorities of the plurality of second syndromes in the second group.

20. The non-transitory computer-readable storage medium according to claim 19, wherein a priority of a non-zero syndrome is higher than a priority of a syndrome whose value is 0.

\* \* \* \* \*